United States Patent
Laighton et al.

(10) Patent No.: US 9,520,853 B2
(45) Date of Patent: Dec. 13, 2016

(54) RADIO FREQUENCY (RF) SERIES ATTENUATOR MODULE FOR BRIDGING TWO RF TRANSMISSION LINES ON ADJACENT CIRCUIT SUBSTRATES

(71) Applicant: Raytheon Company, Waltham, MA (US)

(72) Inventors: Christopher M. Laighton, Boxborough, MA (US); Michael T. Borkowski, Bedford, NH (US); Alan J. Bielunis, Hampstead, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/641,939

(22) Filed: Mar. 9, 2015

(65) Prior Publication Data

US 2016/0268991 A1 Sep. 15, 2016

(51) Int. Cl.
*H03H 7/24* (2006.01)
*H01P 3/08* (2006.01)
*H05K 1/18* (2006.01)
*H05K 1/11* (2006.01)

(52) U.S. Cl.
CPC ........ *H03H 7/24* (2013.01); *H01P 3/08* (2013.01); *H05K 1/113* (2013.01); *H05K 1/184* (2013.01)

(58) Field of Classification Search
CPC ............ H03H 7/24; H01P 3/08; H05K 1/113; H05K 1/184
USPC ...................................................... 333/81 A
See application file for complete search history.

(56) References Cited

U.S. PATENT DOCUMENTS

| | | | | |
|---|---|---|---|---|
| 5,768,109 A | * | 6/1998 | Gulick | ............. H01L 23/13 174/255 |
| 6,118,357 A | * | 9/2000 | Tomasevic | ........... H01L 23/66 257/664 |
| 2008/0272865 A1 | | 11/2008 | Chen et al. | |
| 2014/0210538 A1 | * | 7/2014 | Jordan | ................. H03H 7/25 327/308 |

OTHER PUBLICATIONS

U.S. Appl. No. 14/609,585, filed Jan. 30, 2015, Laighton, et al.
Office Action dated Jun. 2, 2016, U.S. Appl. No. 14/609,585, 26 pages.

* cited by examiner

*Primary Examiner* — Stephen E Jones
*Assistant Examiner* — Scott S Outten
(74) *Attorney, Agent, or Firm* — Daly, Crowley, Mofford & Durkee, LLP

(57) ABSTRACT

An attenuator module having an attenuator disposed on a top surface of a substrate, an input terminal at one end of the attenuator and an output terminal at an opposite end of the attenuator. A pair of spaced electrical conductor pads is disposed on a bottom surface of the substrate, a first one of the pads being disposed under the input terminal and a second one of the pads being disposed under the output terminal. A pair of conductive vias passes through the substrate, one conductive via connecting the input terminal to the first one of the pads and the other conductive via connecting the output terminal to the second one of the pads. The module may be used to interconnect two adjacent circuit substrates.

6 Claims, 4 Drawing Sheets

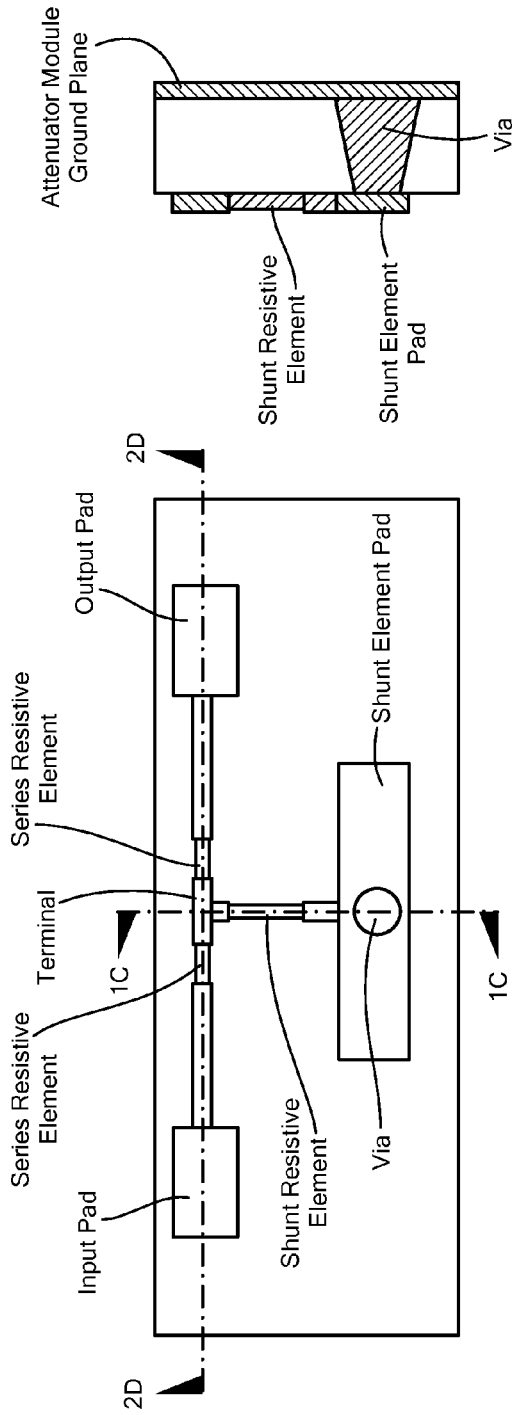
FIG. 1B
PRIOR ART
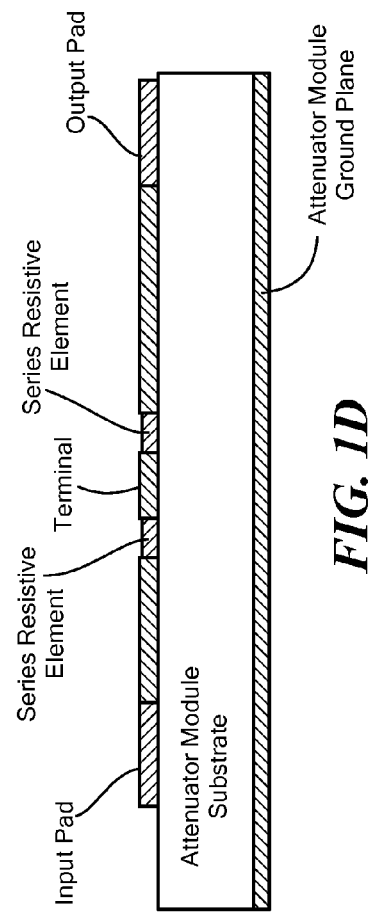
FIG. 1C
PRIOR ART
FIG. 1D
PRIOR ART

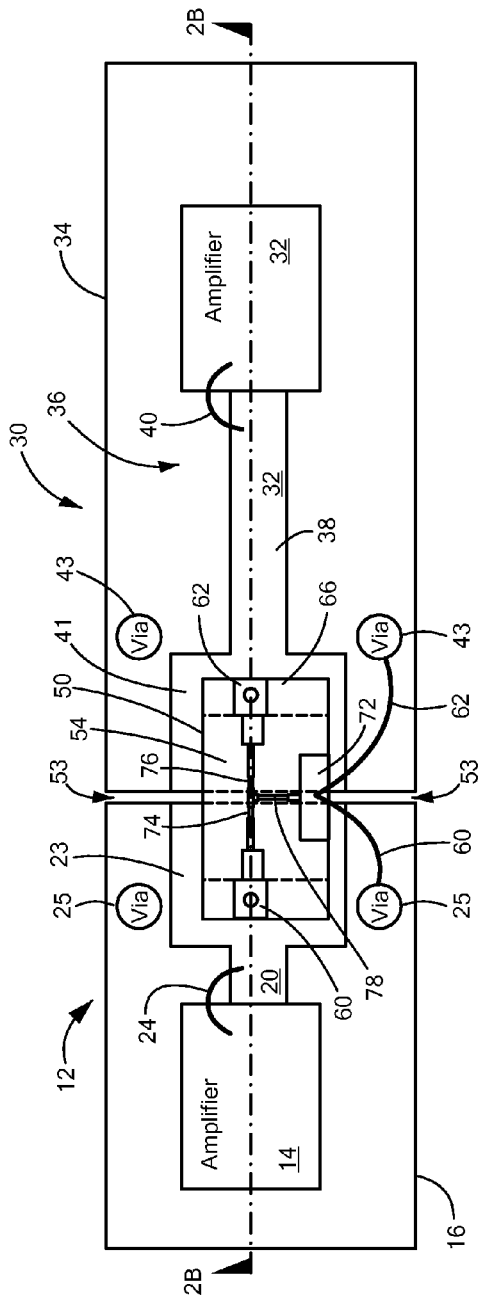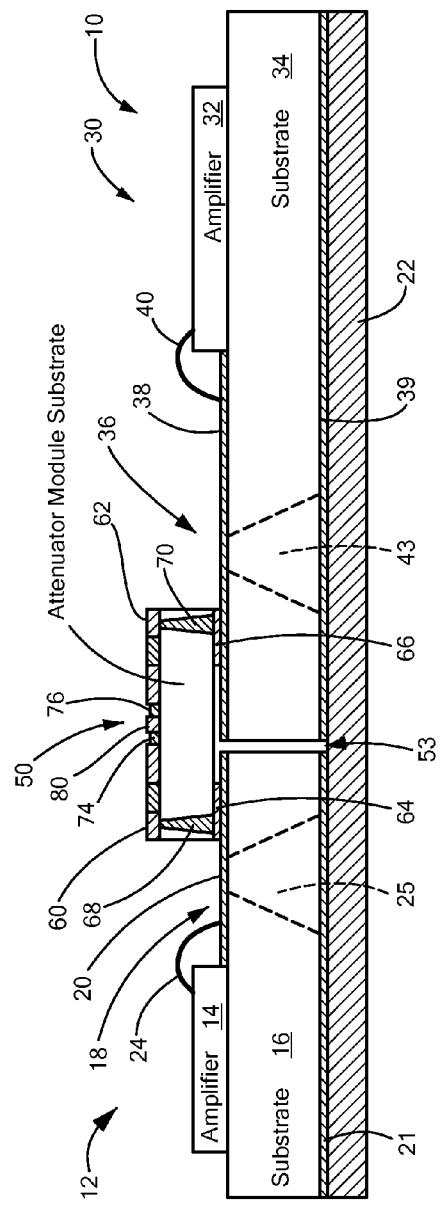
*FIG. 2A*
*FIG. 2B*

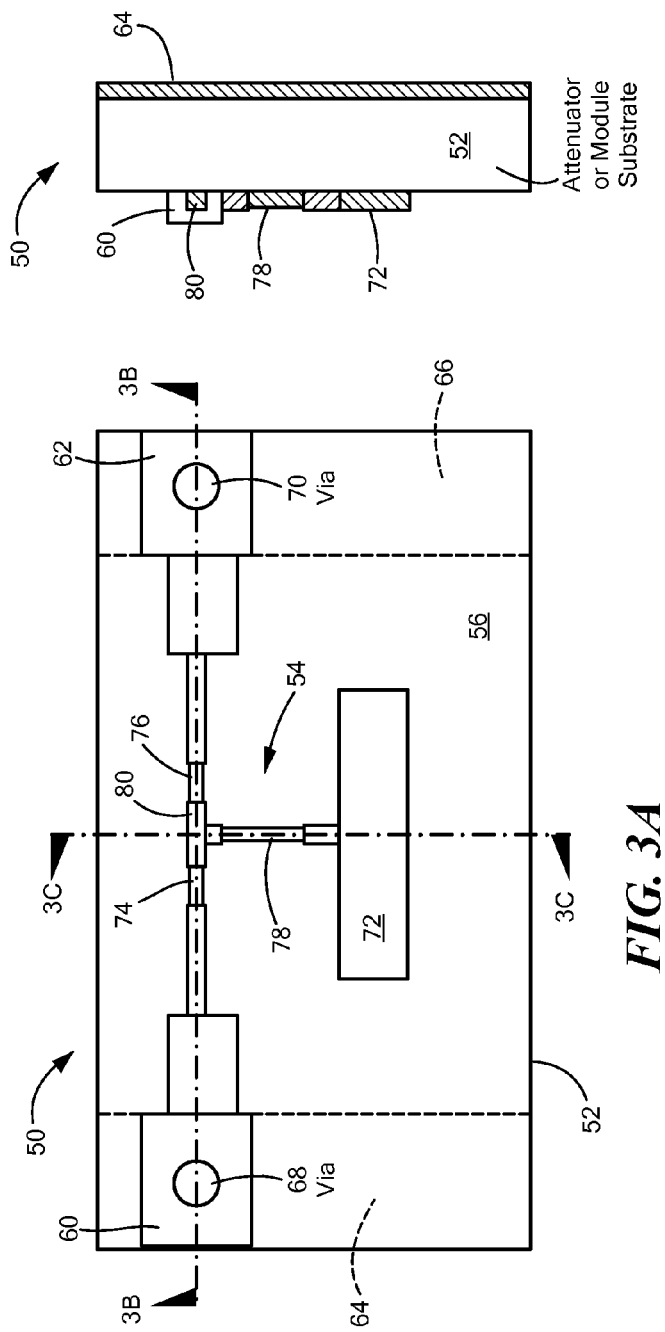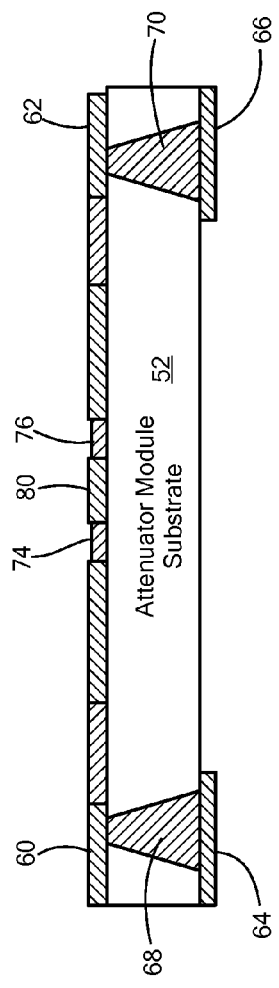

RADIO FREQUENCY (RF) SERIES ATTENUATOR MODULE FOR BRIDGING TWO RF TRANSMISSION LINES ON ADJACENT CIRCUIT SUBSTRATES

TECHNICAL FIELD

This disclosure relates generally to attenuator modules and more particularly attenuator modules used to bridge two transmission lines on adjacent circuit substrates.

BACKGROUND

As is known in the art, many microelectronic circuits, particularly circuits that include amplifiers on separated adjacent substrates sometimes require the installation of an attenuator, such as a broadband T-shaped attenuator at some point along the signal path between two amplifier substrates as shown in FIG. 1A. One type of attenuator, shown in FIGS. 1B-1D, is an attenuator module having a pair of series resistive elements, disposed on an upper surface of an attenuator module substrate, serially connected between an input pad and an output pad, and a shunt resistive element, also disposed on the upper surface of the substrate, connected between a junction between the pair of serially connected resistive elements and a shunt element pad. The shunt element pad is connected to an attenuator ground plane conductor disposed on the bottom surface of the attenuator substrate through a conductive via, as shown in FIG. 1C. The shunt element pad must be connected to the circuit ground plane conductor (which also serves as a DC ground connection) and therefore, the shunt elements pad, being connected to DC ground, must not be connected to the downstream signal path. Thus, when mounting the T-shaped attenuator to the signal line, in order to prevent the shunt resistive element from being connected to the input of the downstream amplifier and also to enable the shunt element pad to be connected to the circuit ground plane conductor, a gap is formed in the signal line where an attenuator is to be installed, as shown in FIG. 1A. Thus, a via is formed through the attenuator substrate in a region between the signal line under the attenuator to the underlying circuit ground plane conductor, as shown. This gap approach has, however, permanently changed the signal line thereby making difficult to go back and change the position of the gap along the signal line where the attenuator is to be re-installed in order to obtain optimal performance. This results in costly amplifier rework and often means the replaced amplifiers have to be handpicked to make sure the signal level is corrected. This can make a major impact on a production line.

SUMMARY

In accordance with the present disclosure an attenuator module is provided having: an attenuator circuit disposed on a top surface of an attenuator module substrate, the attenuator circuit having an input terminal at one end of the attenuator circuit and an output terminal at an opposite end of the attenuator circuit; a pair of spaced electrical conductor pads disposed on a bottom surface of the attenuator module substrate, a first one of the pads being disposed under the input terminal and a second one of the pads being disposed under the output terminal; and a pair of conductive vias passing through the attenuator module substrate, one conductive via connecting the input terminal to the first one of the pads and the other conductive via connecting the output terminal to the second one of the pads.

In one embodiment, the attenuator circuit includes: a ground terminal disposed on the top surface of the substrate; a pair of attenuator elements serially connected between the input terminal and the output terminal; and a shunt attenuator element connected between a terminal between the pair of serially connected attenuator elements and the ground terminal.

In one embodiment, an electrical circuit is provided having: (A) a first substrate having a microwave transmission line, the microwave transmission line having: a signal conductor disposed on a surface of the first substrate; (B) a second substrate, adjacent to the first substrate, the second substrate having a microwave transmission line, the microwave transmission line having: a signal conductor disposed on a surface of the second substrate; and an attenuator module. The attenuator module includes: (1) an attenuator module substrate; (2) an attenuator circuit disposed on a top surface of the attenuator module substrate, the attenuator circuit having an input terminal at one end of the attenuator circuit and an output terminal at an opposite end of the attenuator circuit; (3) a pair of spaced electrical conductor pads disposed on a bottom surface of the attenuator module substrate, a first one of the pads being disposed under the input terminal and a second one of the pads being disposed under the output terminal; (4) a pair of conductive vias passing through the attenuator module substrate, one conductive via connecting the input terminal to the first one of the pads and the other the conductive via connecting the output terminal to the second one of the pads. The first one of the pair of spaced electrical conductor pads is disposed on the signal conductor disposed on a surface of the first substrate and the second one of the pair of spaced electrical conductor pads is disposed on the signal conductor disposed on a surface of the second substrate.

In one embodiment, the attenuator circuit includes: a ground terminal disposed on the top surface of the first substrate; a pair of attenuator elements serially connected between the input terminal and the output terminal; a shunt attenuator element connected between a terminals between the pair of serially connected attenuator elements and the ground terminal.

In one embodiment, the first substrate includes: a conductive pad on a top surface, the second substrate includes: a conductive pad on a top surface; a ground conductor disposed on a bottom surface; and a conductive via passing through the first substrate to connect the conductive pad on a top surface to the ground conductor, and wherein, the ground terminal is connected to conductive pad on the top surface of the second substrate.

With such an arrangement, a MMIC attenuator is provided that routes both signal terminals to the patterned backside so that the component can be placed directly on two adjacent signal traces. The component replaces bond-wire connections and makes rework minimal without permanently changing the configuration. With the arrangement, a T-pad attenuator is provided where all of the resistive components are on the top side but the two signal terminals are directed to the back of the MMIC substrate through vias. On the backside, the signal terminals are separated by patterning the backside metal. The shunt resistor is bonded to ground from the top side.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1B-1D are top, side and end views, respectively, of the attention module used in the electrical circuit of FIG. 1A according to the PRIOR ART;

FIGS. 2A and 2B are top and cross sectional views, respectively, of an electrical circuit having an attenuator module according to the disclosure; and FIGS. 3A-3C are top, side and end views, respectively, of the attention module used in the electrical circuit of FIGS. 2A and 2B according to the disclosure.

Like reference symbols in the various drawings indicate like elements.

DETAILED DESCRIPTION

Figure 1A:
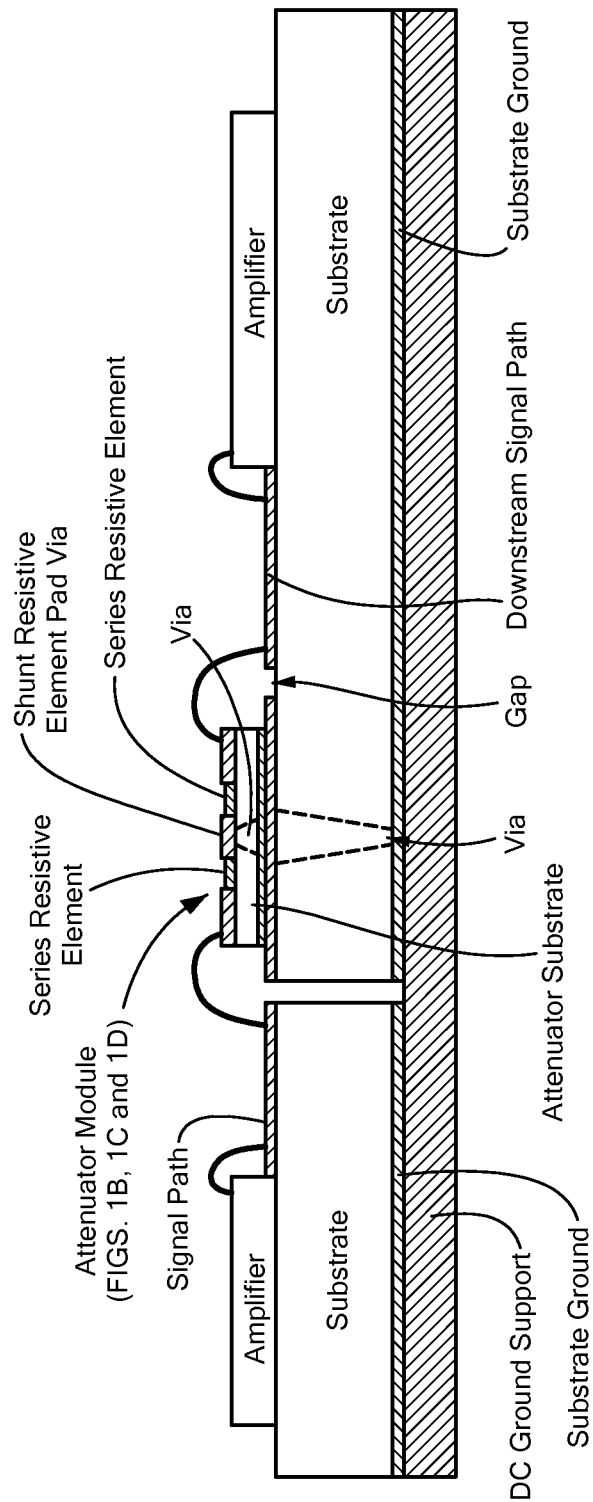
FIG. 1A is cross sectional view of an electrical circuit having an attenuator module according to the PRIOR ART.

Referring now to FIGS. 2A and 2B, an electrical circuit 10 is shown having: a monolithic microwave integrated circuit (MMIC) 12 having, here for example, a radio frequency (RF) amplifier 14; a first substrate 16, here for example, Alumina, having a microwave transmission line 18, here a microstrip transmission line having a strip conductor 20 on the upper surface of the substrate 16 and ground plane conductor 21 on the bottom surface of the substrate 16; however other types of transmission lines such as coplanar waveguide microwave transmission line may be used. In any event the strip conductor 20 is an RF signal conductor 20, and ground conductor 21 is disposed on a DC signal ground plane structure 22, as shown. The amplifier 14 is connected to the strip conductor 20 using air-bridge conductor 24, as shown. It is noted that the monolithic microwave integrated circuit (MMIC) 12 includes a pair of vias 25 passing from the upper surfaced of the module to the ground plane 21. It is also noted that the signal conductor 20 terminates in a wider mounting pad region 23 and that the wider mounting pad region 23 is disposed adjacent the pair of vias 25, as shown, for reasons to be described. It should be further noted that other MMIC circuits may be used.

The electrical circuit 10 includes: second a monolithic microwave integrated circuit (MMIC) 30, here for example, having an radio frequency (RF) amplifier 32; a second substrate 34, here for example, Alumina, having a microwave transmission line 36, here a microstrip transmission line having a strip conductor 38 on the upper surface of the substrate 34 and ground plane conductor 39 on the bottom surface of the substrate 34; however other types of transmission lines such as coplanar waveguide microwave transmission line may be used. In any event the strip conductor 38 is an RF signal conductor 38, and ground conductor 39 is disposed on the DC signal ground 22, as shown. The amplifier 32 is connected to the strip conductor 38 using air-bridge conductor 40, as shown. It is noted that the monolithic microwave integrated circuit (MMIC) 30 includes a pair of vias 43 passing from the upper surfaced of the module to the ground plane 21. It is also noted that the signal conductor 38 commences with a wider mounting pad region 41 and that the wider mounting pad region 41 is disposed adjacent the pair of vias 43, as shown, for reasons to be described. It should be further noted that other MMIC circuits may be used.

The circuit 10 includes an attenuator module 50 shown more clearly in FIGS. 3A, 3B and 3C having: an attenuator module substrate 52, for example, gallium arsenide; an attenuator circuit 54 disposed on one surface, here the top or upper surface 56, of the attenuator module substrate 52. More particularly, the attenuator circuit 54 includes: an input terminal 60 at one end of the attenuator circuit 54 and an output terminal 62 at an opposite end of the attenuator circuit 54 a pair of spaced electrical conductor pads 64, 66 disposed on a bottom surface of the attenuator module substrate 52, a first one of the pads 64 being disposed under the input terminal 60 and a second one of the pads 66 being disposed under the output terminal 62; a pair of conductive vias 68, 70 passing through the attenuator module substrate 52, one conductive via 68 connecting the input terminal 60 to the first one of the pads, here pad 64 and the other conductive vias 70 connecting the output terminal 62 to the second one of the pads, here pad 66. The attenuator circuit 54 includes: a ground terminal 72 disposed on the top surface 56 of the attenuator module substrate 52; a pair of attenuator elements 74, 76, here resistive attenuator elements serially connected between the input terminal 60 and the output terminal 62; a shunt attenuator element 78, here also a resistive attenuator element, connected between a terminal 80 between the pair of serially connected attenuator elements 74, 76 and the ground terminal 72.

Still more particularly, the attenuator resistive elements 74, 76, 78 are here, for example, tantalum nitride (TaN) serially connected along the signal path and a shunt attenuator element here for example, tantalum nitride (TaN) connected between a T-shaped terminal between the pair of serially connected attenuator elements 74, 76 and the ground plane connecting pad 72.

Thus, the output of MMIC 12 is passed through the attenuator circuit 54 and is then fed to MMIC 30. It should be noted that the attenuator module 50 may be easily bonded to the mounting pad regions 23, 41 (FIG. 2A) of the signal conductors 20, 38, respectively, of pair of MMIC modules 12, 32 and spans the region 53 (FIGS. 2A and 2B) between the MMIC modules. It is preferable that the width of the region 53 (the separation between the modules 12, 30 be ¹⁄₂₀ or less of a free space wavelength at the operating frequency. Further, the pads 64, 66 on the bottom of the attenuator substrate 52 are disposed on and mounted to, as by solder or conductive epoxy, not shown, the tops of the mounting pad regions 23, 41, respectively, as shown. Next, the ground terminal 72 is connected to the top of each one of one of the pair of vias 25, 43 on each one of the MMIC modules 12, 32 by wire bonds 60, 62, respectively, as indicated in FIGS. 2B and 2B.

Thus, after evaluating the performance of the circuit 10, the attenuator module 50 may be easily changed to evaluate the impact to these critical electrical parameters. The attenuator module 50 can be easily removed and replaced to try multiple values and configurations. The results of these tests greatly reduce the risk of error in subsequent iteration of the design.

A number of embodiments of the disclosure have been described. Nevertheless, it will be understood that various modifications may be made without departing from the spirit and scope of the disclosure. For example, other attenuator circuit configurations may be used; other microwave transmission line configurations may be used; and the attenuator module may be used in other applications. Accordingly, other embodiments are within the scope of the following claims.

What is claimed is:

1. An electrical circuit, comprising:
   (A) a first structure, comprising:
      (1) a first substrate;
      (2) a first microwave transmission line, the first microwave transmission line having: a first signal conductor disposed on the upper surface of the first substrate;
   (B) a second structure, comprising:
      (1) a second substrate, adjacent to the first substrate;
      (2) a second microwave transmission line, the second microwave transmission line having: a second signal conductor disposed on an upper surface of the second substrate;
   (C) an electrically conductive support having a continuous flat surface, a bottom surface of the first substrate and a bottom surface of the second substrate being mounted to different, adjacent portions of the electrically conductive support, the entire side of the first substrate and the entire side of the second substrate being separated by a gap, the gap being disposed over the continuous flat surface of the electrically conductive support;
   (D) an attenuator module, comprising:
      (1) a third substrate having: a first bottom surface portion disposed over a portion of the first signal conductor; a second bottom surface portion disposed over a portion of the second signal conductor; and a third bottom surface portion disposed between the first bottom surface portion and the second bottom surface portion, the third bottom surface portion being disposed over the gap;
      (2) an attenuator disposed on a top surface of the third substrate, the attenuator having an input terminal at one end of the attenuator and an output terminal at an opposite end of the attenuator;
      (3) a pair of spaced electrical conductor pads disposed on a bottom surface of the third substrate, a first one of the pads being disposed under the input terminal and a second one of the pads being disposed under the output terminal;
      (4) a pair of conductive vias passing through the third substrate, one conductive via connecting the input terminal to the first one of the pads and the other conductive via connecting the output terminal to the second one of the pads; and
   (E) wherein the first one of the pair of spaced electrical conductor pads is disposed on the first signal conductor disposed on the upper surface of the first substrate and the second one of the pair of spaced electrical conductor pads is disposed on the second signal conductor disposed on a surface of the second substrate.

2. The electrical circuit recited in claim 1 wherein the attenuator includes:
   a ground terminal disposed on the top surface of the first substrate;
   a pair of attenuator elements serially connected between the input terminal and the output terminal;
   a shunt attenuator element connected between a terminal between the pair of serially connected attenuator elements and the ground terminal.

3. The electrical circuit recited in claim 2 wherein the first substrate includes: a conductive pad on a top surface; a ground conductor disposed on a bottom surface, the ground conductor being electrically connected to the electrically conductive support; and a conductive via passing through the first substrate to connect the conductive pad on a top surface to the ground conductor; and wherein, the ground terminal is connected to the conductive pad on the top surface of the first substrate through the electrically conductive support.

4. The electrical circuit recited in claim 3 wherein the second substrate includes: a conductive pad on a top surface; a ground conductor disposed on a bottom surface, the ground conductor being electrically connected to the electrically conductive support; and a conductive via passing through the second substrate to connect the conductive pad on a top surface to the ground conductor; and wherein, the ground terminal is connected to conductive pad on the top surface of the second substrate through the conductive via, the ground conductor being electrically connected to the electrically conductive support.

5. A method comprising:
   (a) providing an electrical circuit arrangement, comprising:
      (A) a first structure, comprising:
         (1) a first substrate;
         (2) a first microwave transmission line, the first microwave transmission line having: a first signal conductor disposed on the upper surface of the first substrate;
      (B) a second structure, comprising:
         (1) a second substrate, adjacent to the first substrate;
         (2) a second microwave transmission line, the second microwave transmission line having a second signal conductor disposed on an upper surface of the second substrate;
      (C) an electrically conductive support having a continuous flat surface, a bottom surface of the first substrate and a bottom surface of the second substrate being mounted to different, adjacent portions of the electrically conductive support, the entire side of the first substrate and the entire side of an opposing edge of the second substrate being separated by a gap, the gap being disposed over the continuous flat surface of the electrically conductive support;
      (D) an attenuator module, comprising:
         (1) a third substrate having: a first bottom surface portion disposed over a portion of the first signal conductor; a second bottom surface portion disposed over a portion of the second signal conductor; and a third bottom surface portion disposed between the first bottom surface portion and the second bottom surface portion, the third bottom surface portion being disposed over the gap;
         (2) an attenuator disposed on a top surface of the third substrate, the attenuator having an input terminal at one end of the attenuator and an output terminal at an opposite end of the attenuator;
         (3) a pair of spaced electrical conductor pads disposed on a bottom surface of the third substrate, a first one of the pads being disposed under the input terminal and a second one of the pads being disposed under the output terminal;
         (4) a pair of conductive vias passing through the third substrate, one conductive via connecting the input terminal to the first one of the pads and the other conductive via connecting the output terminal to the second one of the pads; and
      (E) wherein the first one of the pair of spaced electrical conductor pads is disposed on the first signal conductor disposed on the upper surface of the first substrate and the second one of the pair of spaced electrical conductor pads is disposed on the second signal conductor disposed on a surface of the second substrate;

(b) evaluating performance of the electrical circuit arrangement;

(c) changing the attenuator module in accordance with results from the performance evaluating.

6. The method recited in claim 5 wherein the changing comprises removing the attenuator module from the first substrate and the second substrate while the first substrate and the second substrates remain mounted to the electrically conductive support.

\* \* \* \* \*